United States Patent
Wilson et al.

(10) Patent No.: US 9,933,276 B2
(45) Date of Patent: Apr. 3, 2018

(54) METHOD AND APPARATUS FOR ENCODER INTERPOLATION

(71) Applicant: Delta Tau Data Systems, Inc., Chatsworth, CA (US)

(72) Inventors: Curtis Wilson, Sherman Oaks, CA (US); William Olson, Simi Valley, CA (US)

(73) Assignee: Delta Tau Data Systems, Inc., Chatsworth, CA (US)

( * ) Notice: Subject to any disclaimer, the term of this patent is extended or adjusted under 35 U.S.C. 154(b) by 0 days.

(21) Appl. No.: 15/475,829

(22) Filed: Mar. 31, 2017

(65) Prior Publication Data

US 2017/0284826 A1    Oct. 5, 2017

Related U.S. Application Data

(60) Provisional application No. 62/316,251, filed on Mar. 31, 2016.

(51) Int. Cl.
*H03M 1/48*      (2006.01)
*G01D 5/00*      (2006.01)
*H03M 1/20*      (2006.01)
*G01D 5/244*     (2006.01)

(52) U.S. Cl.
CPC .......... *G01D 5/00* (2013.01); *G01D 5/24476* (2013.01); *H03M 1/207* (2013.01)

(58) Field of Classification Search
CPC ........ G01D 5/00; H03M 1/207; H03M 1/203; H03M 1/0621; H03M 1/089; H03M 1/185; H03M 1/10; H03M 1/1009; G03G 3/3068

USPC ................. 341/115, 155, 119, 118
See application file for complete search history.

(56) References Cited

U.S. PATENT DOCUMENTS 6,029,363 A      2/2000   Masreliez et al.
6,639,529 B1 *  10/2003   Jansson ............. G01D 5/24452
                                                    341/110
6,956,505 B2 *  10/2005   Taniguchi ........... H03M 1/1038
                                                    341/11

(Continued)

OTHER PUBLICATIONS

Hunter, Bradley L., "Improved Encoder Interpolator", American Society for Precision Engineering, 2013 Spring Topical Meeting, vol. 55, 2013, pp. 24-28.

(Continued)

*Primary Examiner* — Jean B Jeanglaude
(74) *Attorney, Agent, or Firm* — Murphy, Bilak & Homiller, PLLC

(57) ABSTRACT

Methods and apparatus disclosed herein implement or otherwise embody a technique that compensates for cyclic position errors in encoder-based position detection, wherein the cyclic position errors arise from the presence of harmonic components in the encoder signals relied upon for position determination. Using position-domain compensation for errors arising in the encoder domain offers computational simplicity and impressive compensation performance, even when compensating for a plurality of higher harmonics in the encoder signals, e.g., third harmonic, fifth harmonic, etc. Consequently, even high-precision position monitoring or control can use relatively inexpensive types of encoders known to output encoder signals having significant harmonic components.

18 Claims, 2 Drawing Sheets

(56) References Cited

U.S. PATENT DOCUMENTS

| | | |
|---|---|---|
| 7,109,900 B2 | 9/2006 | Kiriyama et al. |
| 7,384,570 B2 | 6/2008 | Marczak et al. |
| 8,384,570 B2 | 2/2013 | Hunter et al. |
| 2006/0077083 A1 | 4/2006 | Kiriyama et al. |
| 2010/0303460 A1 | 12/2010 | Hunter |
| 2016/0076914 A1 | 3/2016 | Gotz |

OTHER PUBLICATIONS

Wilson, Curtis S., "Automatic Harmonic Error Detection and Correction in Sinusoidal Encoders", 31st ASPE Annual Meeting, Portland, Oregon, Oct. 25, 2016, pp. 1-6.

\* cited by examiner

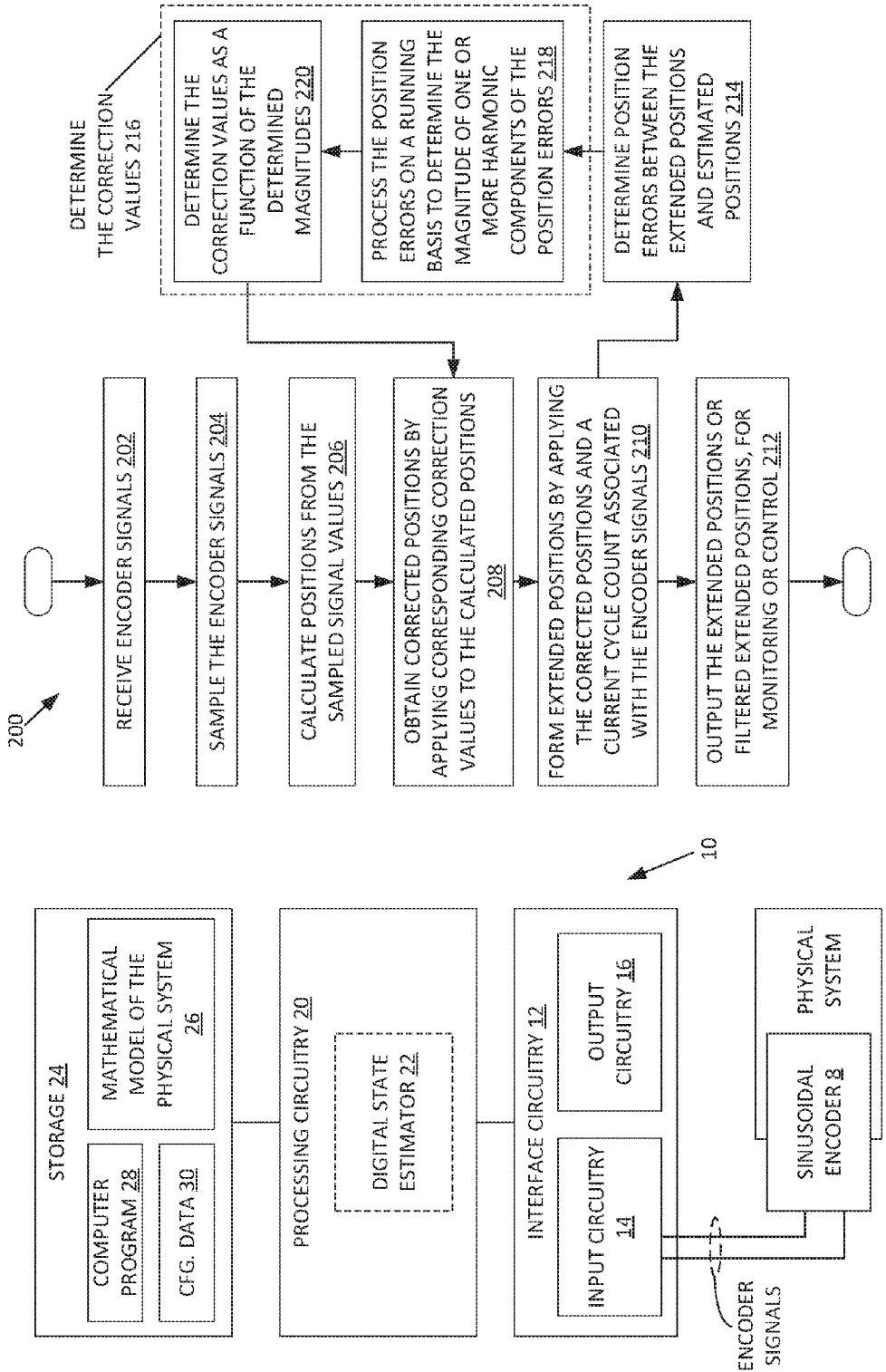

METHOD AND APPARATUS FOR ENCODER INTERPOLATION

RELATED APPLICATIONS

This application claims priority from the U.S. provisional application filed on 31 Mar. 2016 and assigned application No. 62/316,251, which application is incorporated herein by reference.

TECHNICAL FIELD

The present invention generally relates to position encoders and particularly relates to compensating for errors arising from harmonic components present in position encoder signals.

BACKGROUND

A sinusoidal encoder outputs a pair of sinusoidal signals in quadrature phase relationship, with distance covered over one signal cycle of the encoder being referred to as one "line" of the encoder. The term "sinusoid" is used loosely in this context because some encoders, particularly less expensive encoders, output only rough approximations of sinusoids, or otherwise output sinusoids with significant harmonic components in addition to the fundamental frequency component.

A coarse physical position ("position") may be tracked by a running count of the signal cycles over multiple lines of the encoder, and much finer incremental positions may be tracked within each signal cycle via "interpolation." One technique for interpolating the position within each signal cycle relies on the arctangent function, which expresses the incremental or fine position within the current signal cycle as:

$$\phi_{fine} = \tan^{-1}\left(\frac{V_{sin}}{V_{cos}}\right),$$

where $V_{sin}$ and $V_{cos}$ are the instantaneous signal values of the quadrature waveforms output by the encoder. So-called "encoder interpolators" exploit the foregoing angular relationship to provide high-resolution tracking of position within each recurring cycle of a sinusoidal encoder. Precision machining and many other motion-control applications require the higher resolutions that can be provided by good encoder interpolators.

However, errors in the encoder signals directly affect accuracy in position determination, and this point holds true whether the encoder encodes angular or linear positions of a physical system. Merely by way of example, the physical system may be a robotic arm, a machine tool head, or a workpiece holder.

Known approaches to compensation for imperfections—errors—in the encoder signals typically operate in the "encoder domain," which is another way of saying that the corrections are detected and applied with respect to the output signals provided by the encoder in question. Consider, for example, the encoder interpolator detailed in U.S. Pat. No. 8,384,570, which patent is incorporated herein by reference and discloses techniques for compensating for fundamental errors in the encoder signals. Here, fundamental errors include any one or more of voltage offsets on the encoder signals, magnitude mismatches between the encoder signals, and phase error between the encoder signals. The '570 patent provides for such compensation by adjusting the numerical values sampled from the encoder signals.

Potentially significant errors in position detection arise because of harmonic components in the encoder signals. The encoder signals output from a sinusoidal encoder include a fundamental frequency component, which can be understood as the "desired" signal. Unfortunately, the encoder signals may also include undesirable harmonic components. Known encoder compensation techniques contemplate limited forms of harmonic compensation.

U.S. Pat. No. 7,109,900, for example, describes a technique for detecting and compensating the third harmonic component present in encoder signals. The disclosed approach operates in the encoder domain and relies on examining the Lissajous patterns resulting from converting the encoder signals—i.e., sine and cosine signals—into corresponding radius and angle values. Computational complexity limits the viability of the technique, and that complexity especially discourages extension of the technique to higher harmonic components of the fundamental frequency.

SUMMARY

Methods and apparatus disclosed herein implement or otherwise embody a technique that compensates for cyclic position errors in encoder-based position detection, wherein the cyclic position errors arise from the presence of harmonic components in the encoder signals relied upon for position determination. Using position-domain compensation for errors arising in the encoder domain offers computational simplicity and impressive compensation performance, even when compensating for a plurality of higher harmonics in the encoder signals, e.g., third harmonic, fifth harmonic, etc. Consequently, even high-precision position monitoring or control can use relatively inexpensive types of encoders known to output encoder signals having significant harmonic components.

In an example embodiment, a method of encoder interpolation includes receiving encoder signals from a sinusoidal encoder, sampling the encoder signals to obtain sampled signal values, calculating positions from the sampled signal values, obtaining corrected positions by applying corresponding correction values to the calculated positions, and forming extended positions comprising the corrected positions and a current cycle count associated with the encoder signals. The method further includes determining position errors between the extended positions and corresponding estimated positions, as estimated by a digital state estimator that constrains position estimation according to a mathematical model of a physical system whose position is being tracked by the sinusoidal encoder, and outputting the extended positions, or a filtered version thereof, for use in monitoring or controlling the position of a physical system.

Still further, the method includes determining the correction values by processing the position errors on a running basis to determine the magnitude of one or more harmonic components of the position errors, and determining the correction values as a function of the determined magnitudes. Such processing will be understood as detecting and correcting—compensating for—cyclic position errors in the "position" domain, which offers significant computational efficiency as compared to detecting and correcting encoder errors in the encoder signals.

In another example embodiment, an encoder interpolator includes input circuitry configured to receive encoder signals from a sinusoidal encoder and sample the encoder signals to obtain sampled signal values, and processing circuitry configured to calculate positions from the sampled signal values, obtain corrected positions by applying corresponding correction values to the calculated positions, and form extended positions comprising the corrected positions and a current cycle count associated with the encoder signals. The encoder interpolator further includes output circuitry configured to output the extended positions or a filtered version thereof, for use in monitoring or controlling the position of a physical system.

Within the above processing framework, the processing circuitry is configured to determine position errors between the extended positions and corresponding estimated positions, as estimated by an included digital state estimator that constrains position estimation according to a mathematical model of a physical system whose position is being tracked by the sinusoidal encoder. Further, to determine the correction values, the processing circuitry is configured to process the position errors on a running basis to determine the magnitude of one or more harmonic components of the position errors, and determine the correction values as a function of the determined magnitudes.

Of course, the present invention is not limited to the above features and advantages. Those of ordinary skill in the art will recognize additional features and advantages upon reading the following detailed description, and upon viewing the accompanying drawings.

BRIEF DESCRIPTION OF THE DRAWINGS

FIG. 1 is a block diagram of one embodiment of an encoder interpolator.

FIG. 2 is a logic flow diagram of a method of encoder interpolation.

DETAILED DESCRIPTION

Figure 3:
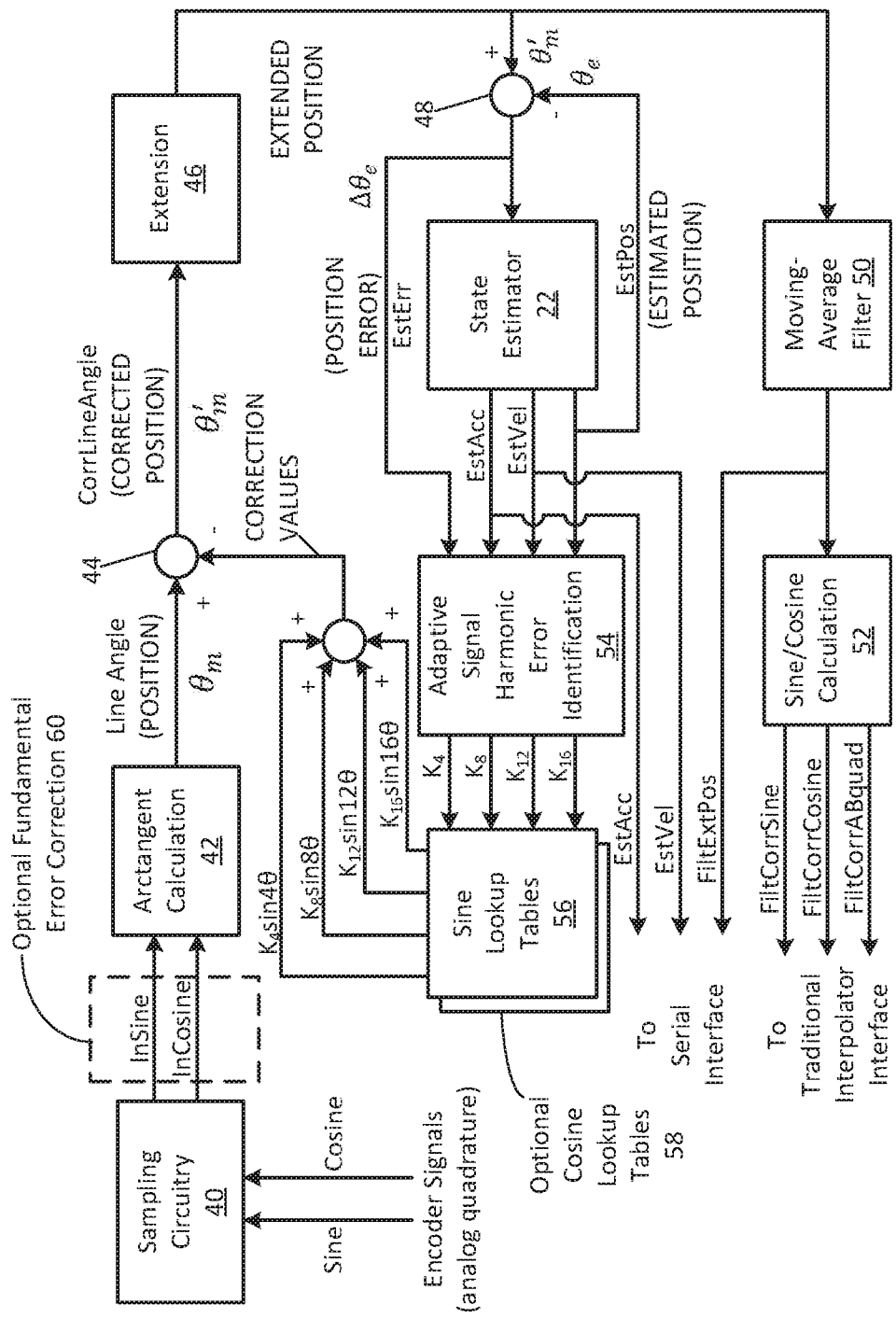
FIG. 3 is a block diagram of one embodiment of processing circuitry configured for encoder interpolation.

FIG. 1 depicts a sinusoidal encoder 8 that is used to track the position of a physical system. The position information is encoded in its output signals, which are at least nominally a pair of analog sinusoids in quadrature relationship. An encoder interpolator 10 receives the encoder signals and processes them for monitoring or controlling the position of the physical system. Movement of the physical system may be linear or angular, or a combination of linear and angular movement, and the encoder signals may encode linear or angular position.

The encoder interpolator 10 includes interface circuitry 12, which includes input circuitry 14 and output circuitry 16. Further included in the example implementation are processing circuitry 20, which includes or otherwise implements a digital state estimator 22, and which includes or is associated with storage 24. The storage 24 in one or more embodiments stores a data structure or set of parameters comprising a mathematical model of the physical system 26, for use by the digital state estimator 22, which uses the system model to estimate positions in correspondence with processing the encoder signals incoming to the encoder interpolator 10. It is also possible for the mathematical model 26 to be incorporated or otherwise hard-coded in the digital state estimator 22.

In at least some embodiments, the storage 24 stores a computer program 28 comprising program instructions that, when executed by a processor, e.g., a microprocessor, within the encoder interpolator 10, causes the encoder interpolator 10 to operate as described herein. Thus, in at least one embodiment, the processing circuitry 20 is realized at least in part by executing computer instructions in one or more processing circuits. More generally, the processing circuitry 20 may be fixed circuitry, programmable circuitry, or a mix of both fixed and programmable circuitry. Correspondingly, the storage 24 in such embodiments comprises one or more types of computer-readable media, such as volatile working memory and non-volatile program memory. Non-limiting examples include any one or more of FLASH, EEPROM, DRAM, and SRAM memory circuits or devices. However implemented, the storage 24 may also store various configuration data 30 for the processing circuitry 20.

With a focus on explaining its operational configuration, the example encoder interpolator 10 comprises input circuitry 14 configured to receive encoder signals from a sinusoidal encoder 8 and sample the encoder signals to obtain sampled signal values. Further, the encoder interpolator 10 includes processing circuitry 20 that is configured to calculate positions from the sampled signal values, obtain corrected positions by applying corresponding correction values to the calculated positions, form extended positions comprising the corrected positions and a current cycle count associated with the encoder signals, determine position errors between the extended positions and corresponding estimated positions, as estimated by the included digital state estimator 22 that constrains position estimation according to a mathematical model of the physical system whose position is being tracked by the sinusoidal encoder 8. The encoder interpolator 10 further includes output circuitry 16 configured to output the extended positions, or a filtered version thereof, for use in monitoring or controlling the position of the physical system.

To determine the correction values, the processing circuitry 20 is configured to process the position errors on a running basis to determine the magnitude of one or more harmonic components of the position errors. Correspondingly, the processing circuitry 20 is configured to determine the correction values as a function of the determined magnitudes. In an example implementation, the processing circuitry 20 is configured to process the position errors on a running basis by performing Fourier-transform processing of the position errors for one or more specific frequencies corresponding to one or more harmonic components for which correction is desired. Limiting the processing to specific frequencies of interest greatly simplifies the associated processing, as compared to performing a Fourier transform over a larger range of frequencies.

The sampling of the input signals, and subsequent processing of the sampled values, including position calculation, digital state estimation, error identification, and position correction, must all operate at a discrete frequency high enough to occur multiple times per the highest position error harmonic to be detected at the maximum physical frequency for which detection is desired. This is a consequence of the well-known Nyquist sampling theorem, which states that such sampling must occur more than twice per cycle of the highest frequency component to be detected. In practice, this means that such sampling and processing must occur at multiple megahertz for typical real-world systems.

More broadly, in one or more embodiments, the processing circuitry 20 is configured to determine the magnitudes of a limited number of harmonic components of the position errors, including at least the fourth harmonic and one or more higher even harmonics. Here, it will be appreciated that odd harmonic components in the encoder signals are manifested as even harmonic components in the position errors. For example, a third harmonic component of the fundamental frequency of the encoder signals results in a fourth harmonic component in the position errors.

Thus, it will be appreciated that the processing circuitry 20 is configured to correct for at least one harmonic component of the position errors and, preferably, is configured to compensate for a fourth harmonic component of the position errors and one or more higher even harmonic components of the position errors. To do so, the processing circuitry 20 is configured to determine the sign and magnitude of the one or more harmonic components of the position errors by calculating coefficients representing the magnitude of sine or cosine components of each harmonic component among the one or more harmonic components of the position errors. When the phrase "sine or cosine" is used herein, and unless otherwise noted or apparent from the context, it shall be understood being one or the other, or both. For example, stating that the processing circuitry 20 determines sine or cosine components of a harmonic component of the position errors shall be understood as saying that the processing circuitry 20 may determine either sine or cosine components, or both sine and cosine components.

As for determining the correction values applied to the positions computed from the encoder signals, the processing circuitry 20 in one or more embodiments is configured to determine the correction values as a function of the determined magnitudes of the sine or cosine components of each harmonic component of the position errors that is being corrected. The processing circuitry 20 does so by, for each calculated position value and each harmonic component of the position errors being corrected, multiplying the calculated position by a multiplier corresponding to the harmonic component being corrected and taking the sine or cosine of the result, and taking the result of the sine or cosine operation and multiplying it by the corresponding coefficient.

In addition to correcting for position errors in the "position domain," the processing circuitry 20 may be configured to compensate the sampled signal values obtained from the encoder signals for at least one of: signal offsets of the encoder signals, magnitude mismatch of the encoder signals, and quadrature phase error of the encoder signals. Such processing improves the sampled signaled values used by the processing circuitry 20 for initial computation of position from the encoder signals, meaning that the corrected positions reflect both compensation for fundamental errors in the encoder signals, as well as compensation for higher-order errors, e.g., third, fifth, and seventh harmonic components. However, it shall be understood that the compensation for higher-order errors in the encoder signals occurs not in the "encoder domain" but rather in the position domain as noted above. Here, the term "position domain" denotes the detection of cyclic position errors and the correction of those errors, based on processing the positions calculated from the encoder signals.

In one or more embodiments, the encoder interpolator 10 is a component of a larger apparatus, e.g., a motion controller that uses the extended positions determined by the encoder interpolator 10 for its motion-control algorithms. More generally, the encoder interpolator 10 is used in association with monitoring or controlling the position of a physical system and in at least some embodiments includes output circuitry 16 that is configured to output the extended positions or filtered extended positions to a controlling or monitoring apparatus, as numerical values provided in a serial or a parallel format. The processing circuitry 20 or the output circuitry 16 may also be configured to generate and output a digital quadrature signal and corresponding digital sine and cosine signals, corresponding to the encoder signals but compensated for the cyclic position errors detected and corrected for by the processing circuitry 20. In other words, the encoder interpolator 20 may be configured to output a recreation of the encoder signals—in the digital domain—from which one or more cyclic position errors are removed.

The encoder interpolator 10 in at least some embodiments provides other useful signals as outputs. For example, in operation, the digital state estimator 22 estimates acceleration from the position errors, integrates the acceleration estimates to obtain velocity estimates, and integrates the velocity estimates to obtain position estimates. Advantageously, in one or more embodiments, the output circuitry 16 is configured to output the estimates of acceleration and velocity from the digital state estimator 22, for use as system feedback states by an associated positioning monitoring or control apparatus. Conventionally, such estimates would remain internal to the state estimation process.

FIG. 2 illustrates one embodiment of a method 200 of encoder interpolation, which may be carried out by the encoder interpolator 10 of FIG. 1, or which may be carried out using any suitable arrangement of processing circuitry. The method 200 shall be understood as a running process that executes repeatedly within and over cycles of the encoder 8.

The method 200 includes receiving (Block 202) encoder signals from a sinusoidal encoder 8, sampling (Block 204) the encoder signals to obtain sampled signal values, calculating (Block 206) positions from the sampled signal values, obtaining (Block 208) corrected positions by applying corresponding correction values to the calculated positions, forming (Block 210) extended positions comprising the corrected positions and a current cycle count associated with the encoder signals, and outputting (Block 212) the extended positions, or a filtered version thereof, for use in monitoring or controlling the position of physical system.

The method 200 further includes, e.g., in a running feedback loop arrangement, determining (Block 214) the position errors between the extended positions and corresponding estimated positions, as generated by the digital state estimator 22. The position errors are used for determining (Block 216) the correction values.

The determining step 216 comprises a "running" process within the larger set of ongoing operations and it includes processing (Block 218) the position errors on a running basis to determine the sign and magnitude of one or more harmonic components of the position errors, and determining (Block 220) the correction values as a function of the determined magnitudes. That is, each newly determined position error feeds into the error-correction process.

The method 200 provides numerous advantages. For example, in the most exacting motion control applications involving the use of high-quality encoders that are already quite good, the compensation of cyclic position errors provides for even higher precision. Further, the method 200 may make it feasible to use lower-quality encoders in at least some applications that would otherwise require more expensive encoders with less harmonic content in their output encoder signals.

On that point, it is common for analog quadrature encoders, even those marketed as "sinusoidal" encoders, to have substantial odd-harmonic content, notably in the third, fifth, seventh, and ninth harmonics. These signal harmonics produce predictable higher even-harmonic position errors in any encoder interpolator that does not compensate for these higher-order harmonics in the encoder signals. For example, matching the third-harmonic component in both encoder signals—i.e., in the quadrature sinusoids output by the encoder—yields cyclic position errors of 4th, 8th, 12th, 16th etc. harmonics of the fundamental signal frequency (the encoder cycle frequency) in any encoder interpolator that lacks the ability to correct for higher-order harmonics in the encoder signals.

If a given harmonic component in the encoder signals is of fraction x of the fundamental signal component, the resulting position error (in radians of a line cycle) can be expressed as:

$$E = \frac{x^1}{1}\sin 4\theta + \frac{x^2}{2}\sin 8\theta + \frac{x^3}{3}\sin 12\theta + \frac{x^4}{4}\sin 16\theta + \ldots$$

For example, with x=0.05, the 4th-harmonic component of the position error has a magnitude of 0.05 radians, or 2.86 degrees, of a line cycle, and the 8th-harmonic component has a magnitude of 0.00125 radians, or 0.07 degrees.

Similarly, the position errors resulting from a matching 5th-harmonic signal component in the encoder signals can be expressed as:

$$E = \frac{x^1}{1}\sin 4\theta - \frac{x^2}{2}\sin 8\theta + \frac{x^3}{3}\sin 12\theta - \frac{x^4}{4}\sin 16\theta + \ldots$$

Matching 7th-harmonic signal components in the encoder signals yield errors of:

$$E = \frac{x^1}{1}\sin 8\theta + \frac{x^2}{2}\sin 16\theta + \frac{x^3}{3}\sin 24\theta + \frac{x^4}{4}\sin 32\theta + \ldots$$

Matching 9th-harmonic signal components in the encoder signals yield errors of:

$$E = \frac{x^1}{1}\sin 8\theta - \frac{x^2}{2}\sin 16\theta + \frac{x^3}{3}\sin 24\theta - \frac{x^4}{4}\sin 32\theta + \ldots$$

If the only signal errors in the encoder signals are matching odd harmonics, the resulting position errors are independent and superimposable, with only $\sin(4N*\theta)$ components. However, if there are fundamental signal errors as well (e.g., quadrature errors, magnitude mismatch, etc.), or if the harmonic component magnitudes are not the same between the sine and cosine signals output from the encoder, there can be cosine position error components as well, and with frequencies of $2N*\theta$ as well. The techniques disclosed herein provide for detection and correction of all such errors.

FIG. 3 depicts one implementation of the encoder interpolator 10 introduced in FIG. 1. The depicted arrangement provides for robust and automatic detection and correction of cyclic position errors arising from higher harmonic components in the encoder signals input to the encoder interpolator 10 for processing. Certain circuitry depicted in the diagram, such as the sampling circuitry 40, may be implemented in the interface circuitry 12 of the encoder interpolator 10. More generally, however, the various computational circuits shall be understood as elements of the overall processing circuitry 20 shown in FIG. 1.

Analog signals from the encoder 8 (which are at least nominally quadrature sinusoids) are digitized in the sampling circuitry 40, to produce sampled signal values corresponding to the analog signals. The sampling circuitry 40 may include other conditioning, such as input signal filtering, etc. In any case, processing downstream from the sampling circuitry 40 shall be understood as involving digital values unless otherwise noted.

The arctangent calculation circuit 42 converts the digitized sine and cosine signals into an uncorrected angle within one line of the encoder 8. It will be appreciated that such operation is carried out on a "running" basis and that the arctangent calculation circuit 42 repeatedly computes line angles during live operation—i.e., multiple line angles are computed within each recurring cycle of the encoder 8. These line angles may also be referred to as "positions." Each such position is a digital value representing the instantaneous angle θ, i.e., the measured phase of the encoder signals. The measured phase will exhibit cyclic errors—cyclic position errors—corresponding to higher-order harmonic components in the encoder signals.

Via a combining circuit 44, each position is combined with a corresponding correction value that compensates for one or more cyclic position errors arising from one or more corresponding harmonic components in the encoder signals. The correction value applied to each position may comprise a composite or combination of values—e.g., correcting for various sine or cosine components of the position error harmonics.

The resulting corrected positions—also referred to as corrected line angles or corrected phase measurements—are "extended" via the extension circuit 46 into so called "extended positions." Each extended position comprises a corrected position and a running cycle count that reflects the current cycle count of the encoder signals. That is, the corrected position is an instantaneous phase measured within one line of the encoder 8 and the running cycle count is an accumulated count of encoder cycles. A given position together with the running cycle count represents an absolute position and the extended positions are, therefore, absolute positions that are compensated for cyclic position errors.

The extended positions and/or position errors derived therefrom are fed into the digital state estimator 22, which comprises circuitry that is configured to use a simplified model of the physical system associated with the encoder 8—e.g., it uses the mathematical model 26. Because the mathematical model 26 of the physical system does not model or provide for movement frequencies higher than are realistically possible for the physical system, the digital state estimator 22 effectively acts as a low pass filter. Given that the position errors produced by signal harmonics in the encoder signals are at very high temporal frequencies at all but the lowest speeds of the encoder, the operation of the digital state estimator 22 is not very sensitive to the values of the system model constants chosen, especially if the cyclic error determination algorithm is only activated above a minimum velocity threshold.

In any case, the operative point here is that the high-frequency errors between the extended positions and the corresponding estimated positions as produced by the digital state estimator 22 can be attributed to measurement errors because the physical system cannot truly operate at such frequencies. In the diagram, a difference circuit 48 outputs position errors based on taking the difference between each estimated position and the corresponding extended position. Here, "corresponding" denotes the extended and estimated positions corresponding to the same line angle or position.

In this regard, it may be helpful to remember that each extended position comprises a running cycle count and a corrected position, i.e., a corrected angle or phase value $\theta'_m$ representing an instantaneous measured phase within one line of the encoder mark, where the accent mark indicates that $\theta'_m$ is the corrected version of the corresponding measured value $\theta_m$ output from the arctangent calculation circuit 42. In the same fashion, the estimated position generated by the digital state estimator 22 in correspondence with each extended position comprises a running cycle count and an estimated instantaneous position $\theta_e$ that nominally matches the $\theta'_m$ term in the corresponding extended position.

The difference circuit 48 determines position errors by taking the "difference" between each estimated position output from the digital state estimator 22 and the corresponding extended position output from the extension circuit 46. In particular, the error that is of interest is the difference in instantaneous phase angles, i.e., the difference between the $\theta'_m$ term of the extended position and the $\theta_e$ term of the corresponding estimated position. The phase angle difference may be denoted as $\Delta\theta_e$. Now, it may happen that the running cycle count maintained by the digital state estimator circuit 22 and the running cycle count used by the extension circuit 46 do not roll over at precisely the same instant, and it will be understood that the difference circuit 48 accounts for any rollover discrepancies when determining the difference between the $\theta'_m$ and $\theta_e$ terms of the respective extended and estimated positions.

The position errors $\Delta\theta_e$ are fed into the adaptive signal harmonic error identification circuit 54, which looks for patterns in the position errors. As a non-limiting example, the circuit 54 shown in the diagram is configured to determine error magnitudes for the 4th, 8th, 12th, and 16th harmonics of the position errors, but other components are possible. The error identification in one or more embodiments is done through a Fourier transform algorithm. With only specific frequencies being examined, the processing is much simpler than performing a "continuous" transform. In other words, the circuit 54 can be preconfigured to determine the magnitudes of only certain, predefined harmonic components. For example, the circuit 54 may be configured to generate magnitude coefficients corresponding to only the 4th, 8th, and 12th harmonic components in the position errors, meaning that it need only perform processing corresponding to these preconfigured harmonic components.

In the diagram, the "K" coefficients output from the adaptive signal harmonic error identification circuit 54 are coefficients for the sine or cosine components of the 4th, 8th, 12th, and 16th harmonic components of the position errors, e.g., as determined via Fourier-transform processing on a running series of position errors $\Delta\theta_e$.

On a running basis, the error coefficients calculated by the circuit 54 are multiplied in a sine lookup table circuit 56 using values dependent on the instantaneous angle within an encoder line $\theta_e$ multiplied by the appropriate harmonic factor N. The resulting products are combined to obtain an overall instantaneous error value—referred to in the diagram as a "CORRECTION VALUES." Thus, a correction value is subtracted from each instantaneous measured position $\theta_m$ to obtain the corresponding corrected position $\theta'_m$. Notably, while correction for the sine components of the 4th, 8th, 12th, and 16th harmonics is explicitly shown in the diagram (i.e. $K_4 \sin 4\theta$ terms and so on), the processing circuitry 20 in one or more embodiments implements a cosine lookup table circuit 58, and the adaptive signal harmonic identification circuit 54 additionally generates magnitude coefficients corresponding to the cosine component of the position-error harmonics being corrected. These cosine-component magnitude coefficients are used by the cosine lookup table circuit 58 to generate correction values for the cosine components and all such correction values are included in the combining operation used to form the correction value to be subtracted from the current position.

With the cyclic error identification and correction algorithm described above always running (or at least always running above a minimum velocity threshold), the encoder interpolator 10 continuously adapts to error patterns that change over position and time. This operation in turn permits high-accuracy results from encoders that are less expensive to make and to install. Note that the most recently determined corrections may continue to be used even when operating below the minimum velocity threshold.

Configuring which error components are detected and removed by the encoder interpolator reflects various tradeoffs in performance versus complexity. The error components that tend to be the largest are the most important to remove. The higher the harmonic in the encoder signal, the lower the corresponding magnitude of position-error harmonic tends to be. For each harmonic component in the encoder signals, the secondary, and especially tertiary, position-error components are significantly smaller than the primary. As a further consideration, it is noted herein that the cosine components from interactions tend to be smaller than the sine components.

The processing circuitry 20 may output the extended positions directly, or may output a filtered version of the extended positions, such as provided for in the diagram via the moving average filter circuit 50. There, one sees that the filter circuit 50 outputs filtered extended positions ("FiltExtPos"), for use in position monitoring or control.

In at least some embodiments, the processing circuitry 20 further provides for regeneration of the quadrature encoder signals, which occurs in the digital domain and provides the advantage of generating encoder signals corresponding to the received encoder signals but minus the cyclic position errors corrected by the processing circuitry 20. Such operations are provided for in the sine/cosine calculation circuit 52, which outputs a digital quadrature signal ("FiltCorrABquad") that it derives from the filtered extended positions. The circuit 52 further outputs filtered sinusoids in quadrature ("FiltCorrSine" and "FiltCorrCosine") that correspond to the encoder signals minus the harmonic encoder-domain content corresponding to the cyclic position errors canceled by the processing circuitry 20 in the position domain.

Still further, the diagram depicts an advantageous implementation of the digital state estimator 22, such as mentioned earlier. Here, the digital state estimator 22 outputs the estimates of acceleration and velocity that it uses for generating the estimated positions. These values represent feedback states that a downstream motion controller or other downstream processing circuitry would have to estimate for position monitoring or control of the physical system, and it is therefore computationally efficient to provide them from the digital state estimator 22. The velocity and acceleration values from the high-frequency based estimation performed by the digital state estimator 22 have lower quantization errors and delays than what the downstream controller could compute itself from the position.

Finally, at least some embodiments of the processing circuitry 20 additionally compensate for fundamental errors in the encoder signals, and include a fundamental error correction circuit 60. The fundamental error correction circuit 60 operates in the "encoder domain" on the encoder signals or the digitized versions thereof, and may be configured according to known techniques to compensate for any one or more of quadrature error in the encoder signals, voltage offsets of the encoder signals, and magnitude mismatch between the encoder signals.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. A method of encoder interpolation comprising:
   receiving encoder signals from a sinusoidal encoder;
   sampling the encoder signals to obtain sampled signal values;
   calculating positions from the sampled signal values;
   obtaining corrected positions by applying corresponding correction values to the calculated positions;
   forming extended positions comprising the corrected positions and a current cycle count associated with the encoder signals;
   determining position errors between the extended positions and corresponding estimated positions, as estimated by a digital state estimator that constrains position estimation according to a mathematical model of a physical system whose position is being tracked by the sinusoidal encoder;
   outputting the extended positions, or a filtered version thereof, for use in monitoring or controlling the position of the physical system; and
   determining the correction values by:
      processing the position errors on a running basis to determine the magnitude of one or more harmonic components of the position errors; and
      determining the correction values as a function of the determined magnitudes.

2. The method of claim 1, wherein processing the position errors on a running basis comprises performing Fourier-transform processing of the position errors for one or more specific frequencies corresponding to one or more harmonic components for which correction is desired.

3. The method of claim 1, wherein the one or more harmonic components of the position error comprise a fourth harmonic and one or more higher even harmonics.

4. The method of claim 1, wherein processing the position errors on a running basis to determine the magnitude of one or more harmonic components of the position errors comprises calculating coefficients representing the magnitude of sine or cosine components of each harmonic component among the one or more harmonic components of the position errors.

5. The method of claim 4, wherein determining the correction values as said function of the determined magnitudes comprises, for each calculated position value and each harmonic component of the position errors being corrected, multiplying the calculated position by a multiplier corresponding to the harmonic component being corrected and taking the sine or cosine of the result, and taking the result of the sine or cosine operation and multiplying it by the corresponding coefficient.

6. The method of claim 1, further comprising compensating the encoder signals or the sampled signal values obtained therefrom for at least one of: signal offsets of the encoder signals, magnitude mismatch of the encoder signals, and quadrature phase error of the encoder signals.

7. The method of claim 1, wherein outputting the extended positions, or the filtered version thereof, comprises outputting the extended positions or filtered extended positions to a controlling or monitoring apparatus, as numerical values provided in a serial or a parallel format.

8. The method of claim 1, further comprising generating and outputting a digital quadrature signal and corresponding digital sine and cosine signals, corresponding to the encoder signals but compensated for cyclic position errors corresponding to the one or more harmonic components of the position errors.

9. The method of claim 1, further comprising, via the digital state estimator, using the mathematical model of the physical system to estimate acceleration, velocity, and position for the physical system based at least in part on the position errors, and outputting the estimates of acceleration and velocity, for use as system feedback states by an associated positioning monitoring or control apparatus.

10. An encoder interpolator comprising:
    input circuitry configured to receive encoder signals from a sinusoidal encoder and sample the encoder signals to obtain sampled signal values;
    processing circuitry configured to:
       calculate positions from the sampled signal values;
       obtain corrected positions by applying corresponding correction values to the calculated positions;
       form extended positions comprising the corrected positions and a current cycle count associated with the encoder signals;
       determine position errors between the extended positions and corresponding estimated positions, as estimated by an included digital state estimator that constrains position estimation according to a mathematical model of a physical system whose position is being tracked by the sinusoidal encoder; and
    output circuitry configured to output the extended positions, or a filtered version thereof, for use in monitoring or controlling the position of the physical system;
    wherein, to determine the correction values, said processing circuitry is configured to:
       process the position errors on a running basis to determine the magnitude of one or more harmonic components of the position errors; and
       determine the correction values as a function of the determined magnitudes.

11. The encoder interpolator of claim 10, wherein the processing circuitry is configured to process the position errors on a running basis by performing Fourier-transform processing of the position errors for one or more specific frequencies corresponding to one or more harmonic components for which correction is desired.

12. The encoder interpolator of claim 10, wherein the processing circuitry is configured to determine the magnitudes of a limited number of harmonic components of the position errors, including at least the fourth harmonic and one or more higher even harmonics.

13. The encoder interpolator of claim 10, wherein the processing circuitry is configured to determine the magnitude of the one or more harmonic components of the position errors by calculating coefficients representing the magnitude of sine or cosine components of each harmonic component among the one or more harmonic components of the position errors.

14. The encoder interpolator of claim 13, wherein the processing circuitry is configured to determine the correction values as said function of the determined magnitudes by, for each calculated position value and each harmonic component of the position errors being corrected, multiplying the calculated position by a multiplier corresponding to the harmonic component being corrected and taking the sine or cosine of the result, and taking the result of the sine or cosine operation and multiplying it by the corresponding coefficient.

15. The encoder interpolator of claim 14, wherein the processing circuitry is further configured to compensate the sampled signal values obtained from the encoder signals for at least one of: signal offsets of the encoder signals, magnitude mismatch of the encoder signals, and quadrature phase error of the encoder signals.

16. The encoder interpolator of claim 10, wherein the output circuitry is configured to output the extended positions or filtered extended positions to a controlling or monitoring apparatus, as numerical values provided in a serial or a parallel format.

17. The encoder interpolator of claim 10, wherein the processing circuitry is configured to generate and output a digital quadrature signal and corresponding digital sine and cosine signals, corresponding to the encoder signals but compensated for cyclic position errors corresponding to the one or more harmonic components of the position errors.

18. The encoder interpolator of claim 10, wherein the digital state estimator is configured to use the mathematical model of the physical system to estimate acceleration, velocity, and position for the physical system based at least in part on the position errors, and wherein the output circuitry is further configured to output the estimates of acceleration and velocity, for use as system feedback states by an associated positioning monitoring or control apparatus.

* * * * *